United States Patent
Gupta et al.

(10) Patent No.: US 12,425,039 B2
(45) Date of Patent: Sep. 23, 2025

(54) TIME-INTERLEAVED ADC SKEW CORRECTION

(71) Applicant: NXP B.V., Eindhoven (NL)

(72) Inventors: Sushil Kumar Gupta, Bangalore (IN); Kamlesh Singh, Noida (IN)

(73) Assignee: NXP B.V., Eindhoven (NL)

( * ) Notice: Subject to any disclaimer, the term of this patent is extended or adjusted under 35 U.S.C. 154(b) by 252 days.

(21) Appl. No.: 18/296,741

(22) Filed: Apr. 6, 2023

(65) Prior Publication Data
US 2024/0137034 A1 Apr. 25, 2024

(30) Foreign Application Priority Data
Oct. 13, 2022 (IN) .............................. 202211058527

(51) Int. Cl.
| H03M 1/10 | (2006.01) |
| H03M 1/06 | (2006.01) |
| H03M 1/08 | (2006.01) |
| H03M 1/12 | (2006.01) |

(52) U.S. Cl.
CPC ....... H03M 1/1014 (2013.01); H03M 1/0624 (2013.01); H03M 1/0836 (2013.01); H03M 1/1215 (2013.01)

(58) Field of Classification Search
CPC ............. H03M 1/1014; H03M 1/0624; H03M 1/0836; H03M 1/1215
USPC .......................................... 341/118, 120, 155
See application file for complete search history.

(56) References Cited

U.S. PATENT DOCUMENTS

| 4,857,927 A | * | 8/1989 | Takabayashi ....... H03M 1/0639 |
| | | | 341/200 |
| 9,143,147 B1 | * | 9/2015 | Ray ......................... H03M 1/12 |
| 10,340,934 B1 | * | 7/2019 | Rakuljic ............. H03M 1/1033 |
| 10,790,850 B1 | | 9/2020 | Lin et al. |
| 10,868,555 B2 | | 12/2020 | Dyachenko et al. |

OTHER PUBLICATIONS

Belcher: "The use of multi tone dither in high speed A/D conversion", 1994 Second International Conference on Advanced A-D and D-A Conversion Techniques and their Applications, Jul. 6-8, 1994, Cambridge, UK, pp. 153-158.

* cited by examiner

*Primary Examiner* — Khai M Nguyen

(57) ABSTRACT

A time-interleaved analog to digital converter (ADC) circuit includes an input signal amplitude detector configured to determine an input signal amplitude of an analog input signal, a multi-tone signal generator configured to generate a plurality of analog and digital sinusoidal signals having an amplitude dependent on the determined input signal amplitude, and an analog input summing module configured to provide a summed output analog signal from the analog input signal and the analog sinusoidal signals. A time-interleaved ADC has an input coupled to receive the summed output analog signal from the analog input summing module and configured to provide a timing skew-calibrated digital output signal from the summed output analog signal. A digital output subtractor module is configured to provide a digital output signal at an output of the circuit from the digital output signal from the time-interleaved ADC and the digital sinusoidal signals from the multi-tone signal generator.

18 Claims, 11 Drawing Sheets

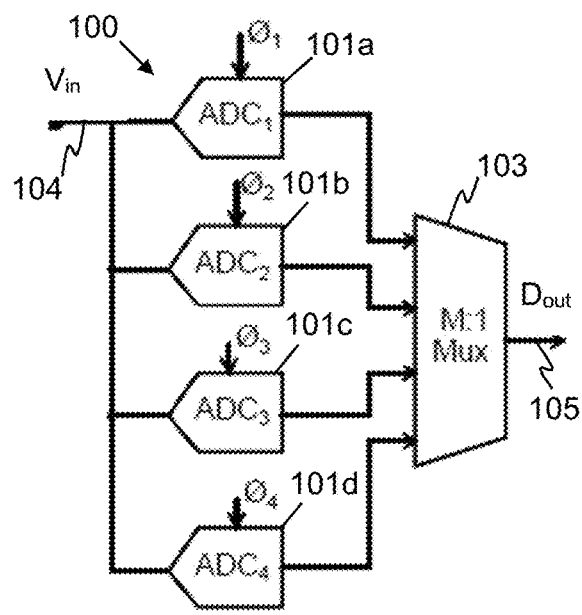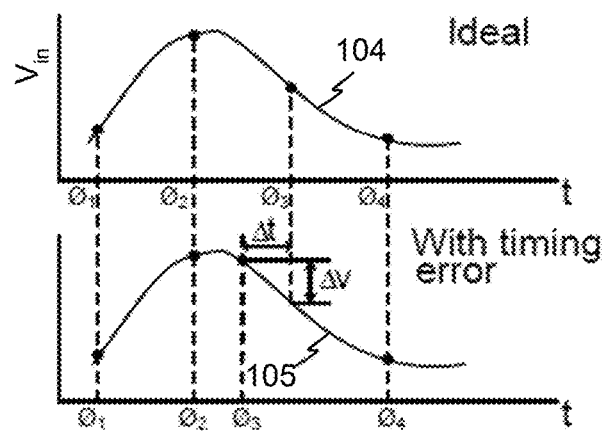
FIG. 1a
FIG. 1b

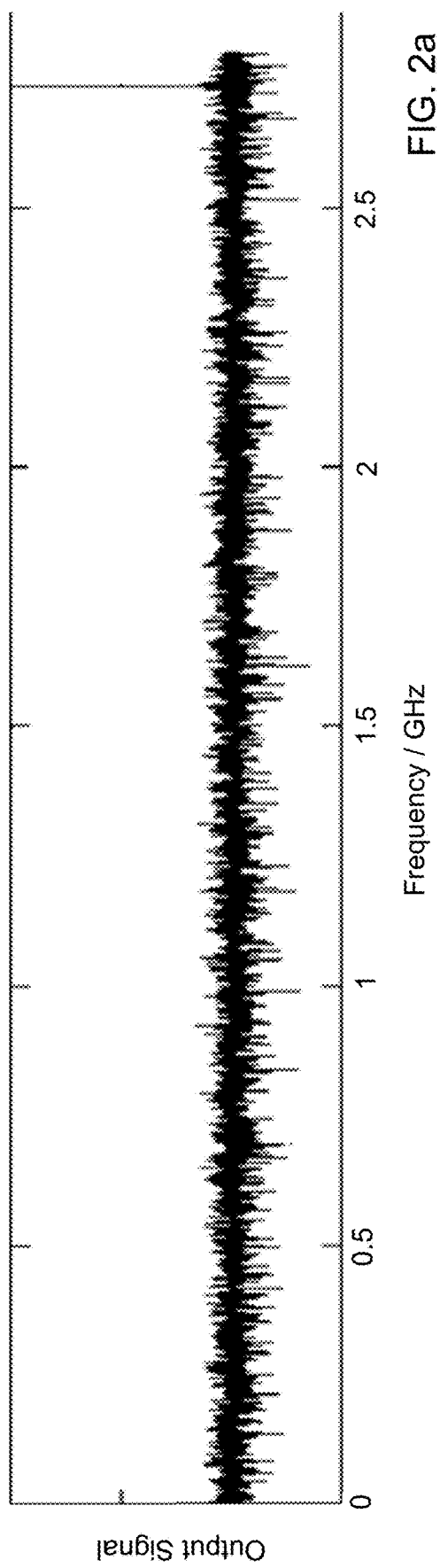
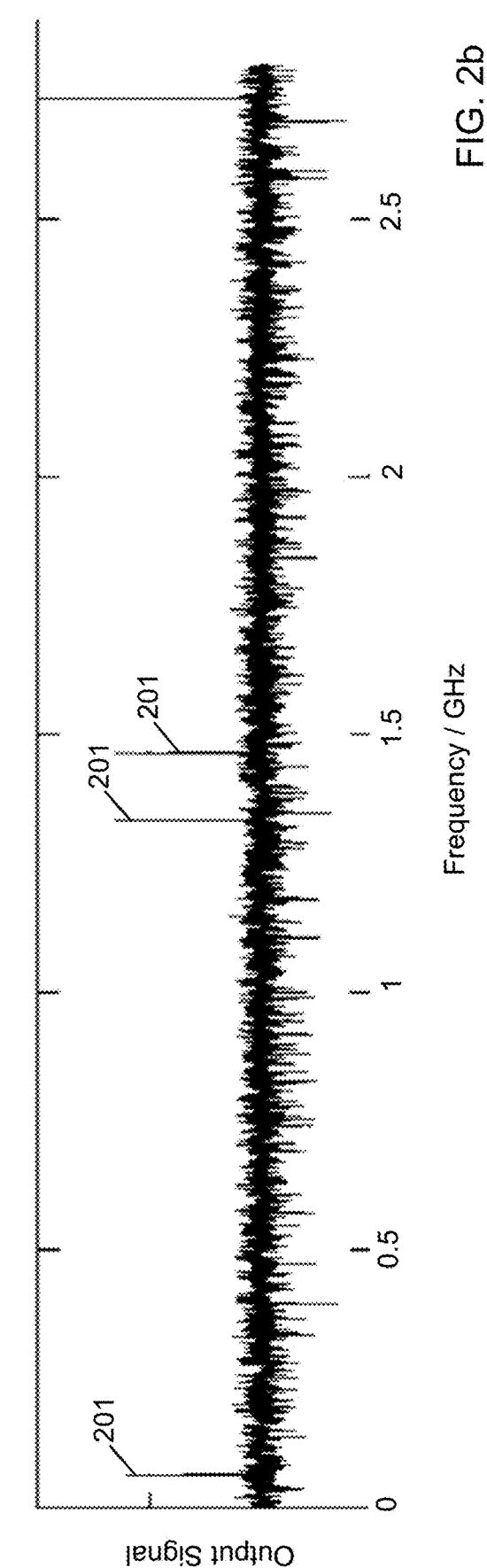

TIME-INTERLEAVED ADC SKEW CORRECTION

CROSS-REFERENCE TO RELATED APPLICATIONS

This application claims the priority under 35 U.S.C. § 119 of India application No. 202211058527, filed on 13 Oct. 2022, the contents of which are incorporated by reference herein.

FIELD

The disclosure relates to phase, or timing error, correction of high sampling rate time-interleaved ADCs.

BACKGROUND

Many applications now require high bandwidth ADCs operating at frequencies of several GHz or higher. Time-interleaving is a known technique to achieve high frequency sampling through use of multiple phases of a lower frequency clock signal to sample at a higher frequency. However, time-interleaved ADCs can suffer from various artifacts associated with mismatch between different time-interleaved ADC channels. These artifacts can severely degrade the ADC performance. Sampling at the wrong time, known as timing skew, will lead to a distortion in the signal at the output of the ADC that is dependent on the rate of change of the input signal. Gain and offset mismatch, along with skew in sampling time of the ADC channels, are the main factors that cause these artifacts and degrade the performance of a time-interleaved ADC. Gain and offset mismatch are mostly static in nature and are relatively simple to correct for. Sampling time mismatch (timing skews) between ADC channels may be dynamic in nature, for example depending on the frequency of the input signals, and can therefore be more challenging to correct for.

BRIEF DESCRIPTION OF DRAWINGS

Embodiments will be described, by way of example only, with reference to the drawings, in which:

FIG. 1a is a schematic diagram of an example time-interleaved ADC;

FIG. 1b is an example plot of the analog input signal $V_{in}$ of the time-interleaved ADC of FIG. 1a as a function of time;

FIG. 2a is an example plot of output signal as a function of frequency for a skew-corrected time-interleaved ADC;

FIG. 2b is an example plot of output signal as a function of frequency for a time-interleaved ADC with timing skews;

Figure 3:
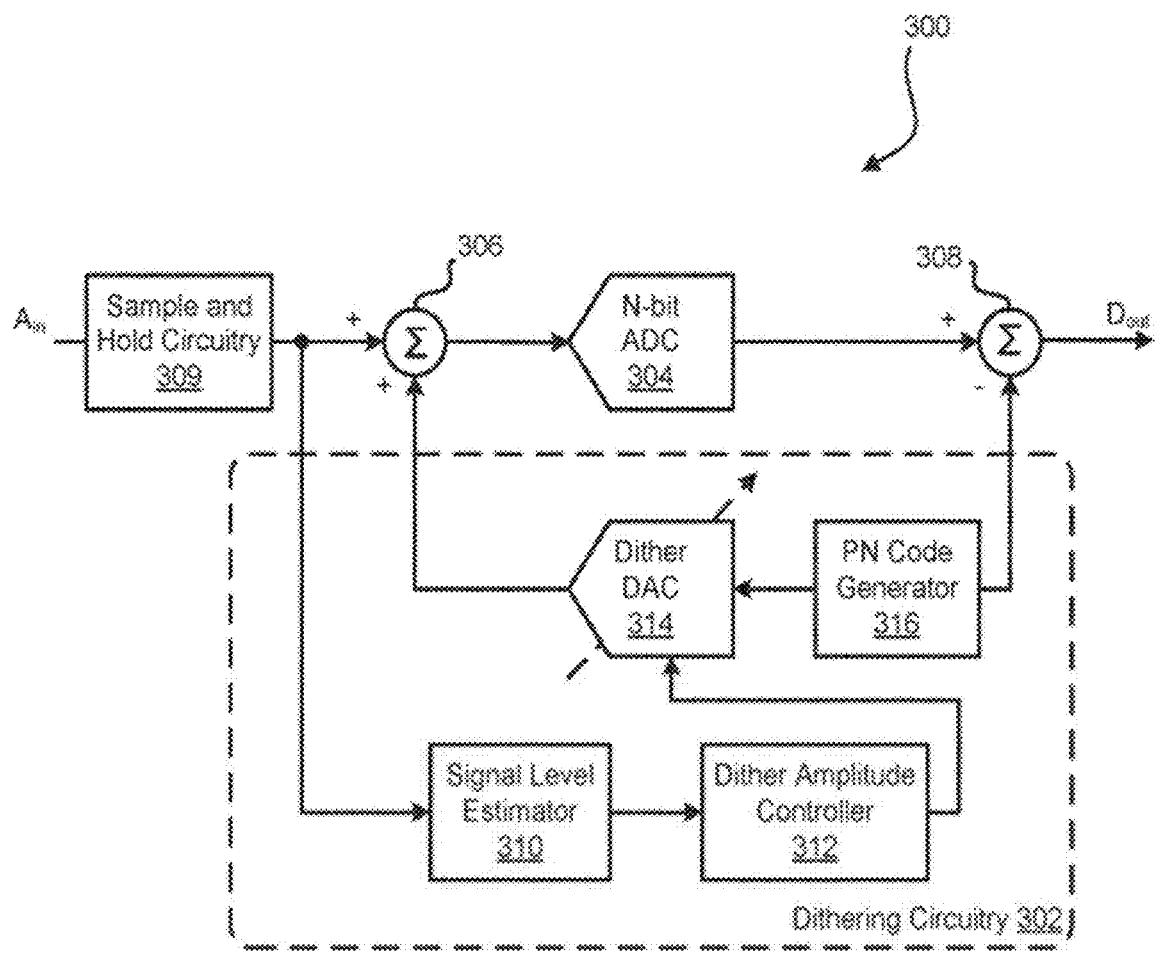
FIG. 3 is a schematic diagram of an example time-interleaved ADC.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 is a schematic diagram of an example time-interleaved ADC 100. The ADC 100 comprises a plurality of ADC channels 101a-d and a multiplexer 103. The ADC channels 101a-d each receive a common analog input signal $V_{in}$ from an input 104 of the ADC 100 and provide respective phase delayed digital output signals $D_{\phi 1}$-$D_{\phi 4}$ to the multiplexer 103. The phase delays associated with the respective phase delayed digital output signals $D_{\phi 1}$-$D_{\phi 4}$ arise from phase inputs $\phi_1$-$\phi_4$. The phase inputs $\phi_1$-$\phi_4$ may be predetermined based on a desired sampling rate $f_s$, such that the phase difference between consecutive ADC channels results in each ADC channel sampling $T_s=1/f_s$ seconds later than a preceding ADC channel, where $T_s$ is the sampling period. For the time-interleaved ADC 100 to sample at a higher rate than an individual ADC channel, the sampling rate $f_s$ is chosen to be higher than the sampling frequency of an individual ADC channel 101a-d.

The multiplexer 103 selectively connects the outputs of the ADC channels 101a-d to the output 105 of the time-interleaved ADC 100 one at a time to provide the digital output $D_{out}$. The ADC channels 101a-d are connected to the output 105 of the time-interleaved ADC 100 in sequential order, i.e. starting with ADC channel 101a and finishing with ADC channel 101d and then repeating the sequence.

The multiplexer 103 selects the next ADC channel 101a-d in the sequence every $T_s$+L seconds, where L is the fixed conversion time of each individual ADC channel 101a-d. The recombined digital output signal $D_{out}$ at the output of the time-interleaved ADC 100 has a sampling rate $f_s$ where the individual ADC channels 101a-d would have has a sampling rate of $f_s/n$, where n is the number of ADC channels (n=4 for the four channels in FIG. 1a).

FIG. 1b is an example plot of the analog input signal $V_{in}$ against time, illustrating sequential samples with and without timing errors. The plot 104 shows the ideal case where the ADC channels 101a-d sample with a correct phase delay $\phi_1$-$\phi_4$ with respect to each other. The plot 105 shows a non-ideal case where a timing error (or skew) Δt is introduced in phase delay $\phi_3$, resulting in an amplitude error Δv. The amplitude error Δv results in a distortion of the digital output signal $D_{out}$ compared to the analog input signal $V_{in}$. Over the course of many sampling cycles, this can lead to timing spurs, which are represented as spikes in amplitude at a given frequency caused by the timing skew.

FIG. 2a illustrates an example ADC output spectrum with no timing skew error for a 4×interleaved ADC, i.e. the time-interleaved ADC of the type illustrated in FIG. 1a. Introducing timing skew errors of only up to around 4.5 ps results in the output spectrum illustrated in FIG. 2b, where substantial spikes 201 can be clearly seen in the output spectrum at around 0.1, 1.3 and 1.45 GHz. Small timing skew errors can thereby result in significant distortions to the output signal.

FIG. 3 illustrates an example ADC circuit 300 from U.S. Pat. No. 10,790,850, in which random dithering is used to improve linearity of the ADC. The ADC circuitry 300 includes dithering circuitry 302, an ADC 304, adder 306, subtractor 308 and sample and hold circuitry 309. Dithering circuitry 302 includes a signal level estimator 310, dither DAC 314 and pseudo-noise code generator 316.

Pseudo noise generated by the pseudo-noise code generator is converted to an analog signal by the dither DAC 314 and added to the input signal provided to the ADC 304, with an amplitude of the pseudo noise being dependent on an amplitude of the input signal. The same pseudo noise in digital form is removed from the output digital signal by the subtractor 308. The result is that the SFDR (spurious-free dynamic range) of the circuit is improved. Timing errors of the ADC 304 are however not affected.

Figure 4:
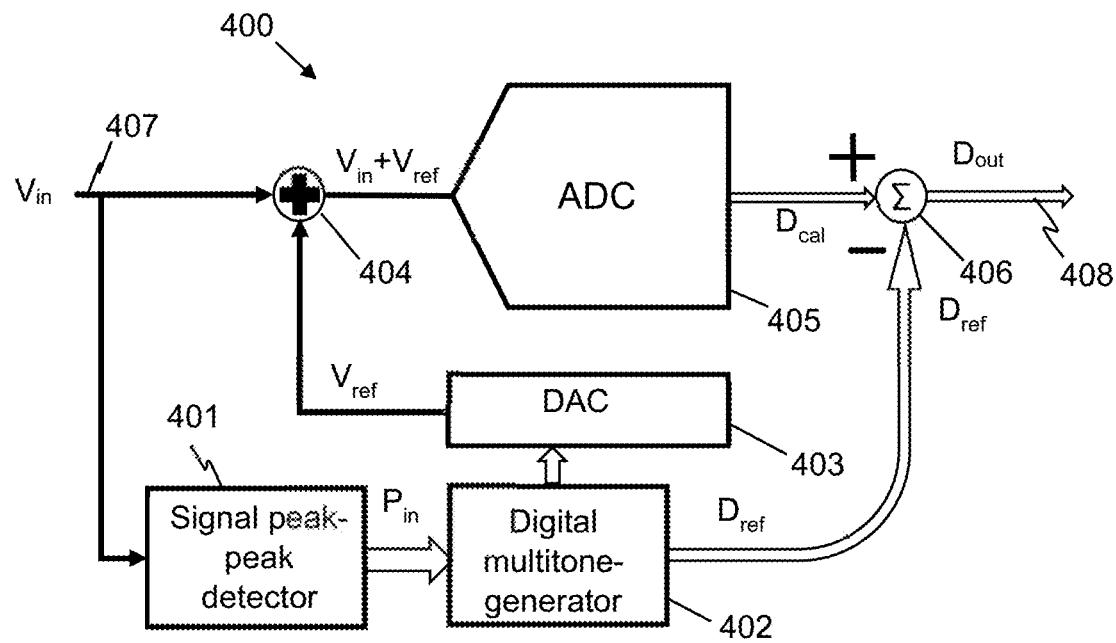
FIG. 4 is a schematic diagram of an example time-interleaved ADC circuit according to an embodiment.

FIG. 4 illustrates an example time-interleaved ADC circuit 400. The circuit 400 comprises an input signal amplitude detector 401, a digital multi-tone generator 402, a digital to analog converter (DAC) 403, an analog input signal summing module 404, a time-interleaved ADC 405 with built-in skew calibration, and an digital output subtractor module 406. The input signal amplitude detector 401 measures a peak-peak amplitude $P_{in}$ of an analog input signal $V_{in}$ provided at an input 407 of the circuit 400. The peak-peak input signal amplitude $P_{in}$ is provided to the digital multi-tone signal generator 402, which generates a plurality of reference fixed frequency tones having an amplitude that is dependent on the peak-peak amplitude $P_{in}$ of the analog input signal $V_{in}$. The tones are generated digitally to provide digital sinusoidal signals $D_{ref}$ that are provided to the digital output subtractor module 406 and converted by the DAC 403 to provide analog sinusoidal signals $V_{ref}$ to the analog input summing module 404. The analog input summing module 404 combines the analog input signal $V_{in}$ with the analog sinusoidal signals $V_{ref}$ to provide a combined analog input signal $V_{in}+V_{ref}$ to the ADC 405. The ADC 405 converts the combined analog input signal $V_{in}+V_{ref}$ into a timing skew-calibrated digital output signal $D_{cal}$. The timing skew-calibrated digital output signal $D_{cal}$ is combined with the digital sinusoidal signals $D_{ref}$ by the digital output subtractor module 406 to provide a digital output signal $D_{cal}-D_{ref}$ at the output 408 of the circuit.

The input signal amplitude detector 401 may be a signal peak detector that is configured to detect the instantaneous peak of the input signal $V_{in}$ and provide an output peak amplitude $P_{in}$ in digital form to the digital multi-tone signal generator 402. The input signal amplitude detector 401 may for example comprise an ADC that can have have a resolution lower than that of the ADC 405, since an accurate measure of the amplitude is not required, only an estimate of the current peak amplitude that is constantly updated and provided to the multi-tone signal generator 402. The speed requirement of the input signal amplitude detector will depend on the required bandwidth of the circuit 400 and the signal profile, and can be designed accordingly.

Figure 5:
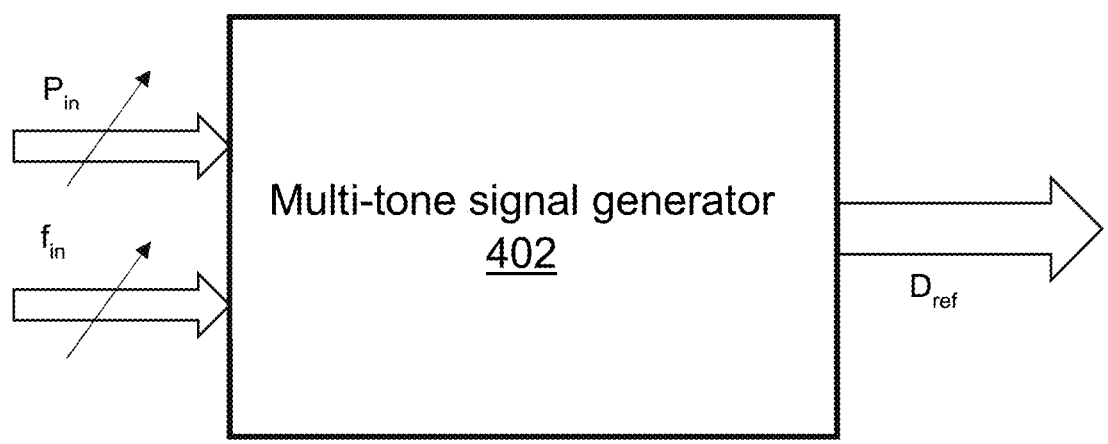
FIG. 5 is a schematic diagram of an example digital multitone generator for the circuit of FIG. 4.

As illustrated further in FIG. 5, the multi-tone signal generator 402 provides a plurality of digitally generated reference tones $D_{ref}$ with an amplitude that is dependent on the input signal peak amplitude $P_{in}$ provided by the input signal amplitude detector 401 and dependent on input frequencies fin. The multi-tone signal generator 402 may generate the output reference tones $D_{ref}$ by direct digital synthesis, in which an internal memory storing pre-defined floating point numbers is used to synthesize sinusoidal waveforms of various frequencies, the amplitude of each tone being digital controlled. The digital output bits of the generator 402 may be defined according to the noise requirements of the ADC 405 and its resolution (i.e. the sine wave accuracy in terms of number of digital bits) may be the same as that of the ADC 405.

Figure 6:
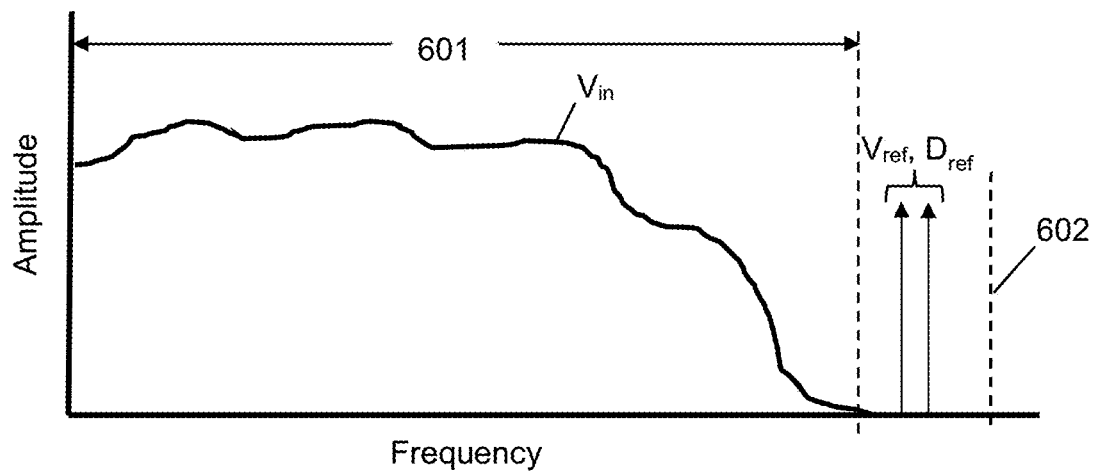
FIG. 6 is a schematic plot of a bandwidth-limited signal amplitude as a function of frequency for the example time-interleaved ADC circuit of FIG. 4.

As illustrated schematically in FIG. 6, the multi-tone signal generator 402 may generate a plurality of reference tones $V_{ref}$, $D_{ref}$ at frequencies above a frequency range 601 of the analog input signal $V_{in}$ and below a Nyquist frequency limit 602 of the ADC 405, i.e. half of the sampling rate of the ADC 405. This enables the digitally generated reference tones $D_{ref}$ to be extracted from the digital output signal of the ADC with minimal impact on the accuracy of analog to digital conversion. The use of multiple tones avoids any correlation with the ADC input signal, making the skew calibration carried out by the ADC 405 more efficient.

The multi-tone signal generator 402 may provide the digital sinusoidal signal $D_{ref}$ to the digital output subtractor module 406 with a delay relative to the analog sinusoidal signals $V_{ref}$ provided to the analog input summing module 404 so that the output digital signal $D_{cal}$ from the ADC 405 and the digital sinusoidal signal $D_{ref}$ are time synchronised at the digital output subtractor module 406 to enable the input sinusoidal signals to be removed.

The DAC 403 between the multi-tone signal generator 402 and the analog input summing module 404 may also include a bandpass analog filter to filter the output of the DAC 403 to remove any undesired higher harmonics or noise generated by the DAC 403. The analog filter may also be configured to filter components of the signal $V_{ref}$ that may be within a non-linear operating region of the DAC 403. The DAC 403 may for example comprise a current steering DAC, which is advantageous in minimising delay. The time delay may be predetermined based on the known processing speeds of the DAC 403, analog input summing module 404 and time-interleaved ADC 405.

Figure 7:
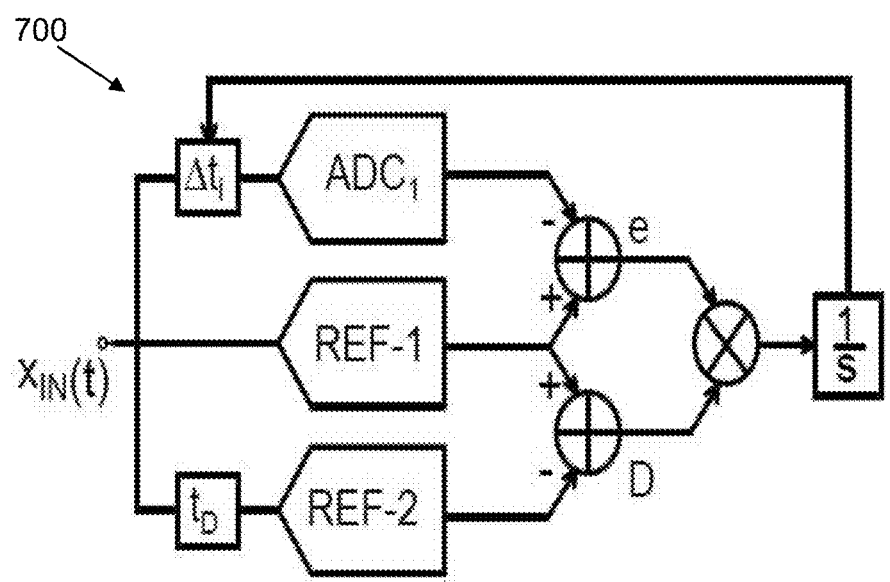
FIG. 7 is an example timing calibration loop response that may be applied to the time-interleaved ADC of FIG. 4.

The time-interleaved ADC 405 is configured to receive the summed analog signal $V_{in}+V_{ref}$ from the analog input summing module 404 and provide a timing skew-calibrated output signal $D_{cal}$. The ADC 405 comprises multiple individual ADC channels similar to that illustrated in FIG. 1a. One of the individual ADC channels is selected as a reference ADC channel, which is used to measure the relative sampling phase skew of the other ADC channels by tracking the phase of the analog reference signal $V_{ref}$ in each ADC channel with respect to the reference ADC channel. The time-interleaved ADC 405 may carry out skew calibration according to various schemes. An example of such a scheme is described by Mehta, in "*Sampling Time Error Calibration for Time-Interleaved ADCs*", TU Delt MSc Thesis, Aug. 29, 2013, from which the example timing loop calibration circuit 700 illustrated in FIG. 7 is taken.

The timing calibration loop 700 uses an additional reference lane to estimate the derivative of the input signal. The timing error is corrected by a feedback signal $\Delta t_i$. As this feedback signal is in the analog domain, the accuracy requirement on computing derivative is greatly relaxed. The simplest method to find $\Delta t_i$ such that it corrects the timing error is by employing an iterative algorithm, which may be an LMS (least mean square) iterative algorithm. Applying the LMS algorithm can be used to obtain a new value of $\Delta t_i$ according to the following relationship:

$$\Delta t_{(i+1)} = \Delta t_i - \mu_t \frac{de^2}{d(\Delta t)} = \Delta t_i - 2\mu_t eD$$

where, $\mu_t$ is the LMS coefficient for the timing calibration loop. To detect the timing error a product of the error signal e and the derivative of the input signal D needs to be computed to remove the dependency of the error signal e from the sign of the input signal. The error signal not only depends on $\Delta t$ but also on D. Depending on the slope of the input signal, the sign of D can be either positive or negative. If the feedback loop operates only by observing the error signal e then its direction can change if the slope of input signal flips. Thus, it will be highly unstable. If the feedback loop operates on the LMS equation given above, this problem of stability is resolved. The integrator can control $\Delta t_i$ through a negative feedback such that the mean of the product e·D is driven towards zero. For a timing mismatch of $\Delta t$, if the mean of e·D is negative then the loop would increase $\Delta t i$ towards $\Delta t$. Whereas, if the mean of e·D is positive then the loop will reduce $\Delta t_i$ towards $\Delta t$. When the loop converges, the mean of e·D is zero. Thus, the loop is completely independent of the slope of the input signal. Depending on the value of $\mu_t$ the negative feedback can be made unconditionally stable, which is necessary for the calibration loop to converge.

Figure 8:
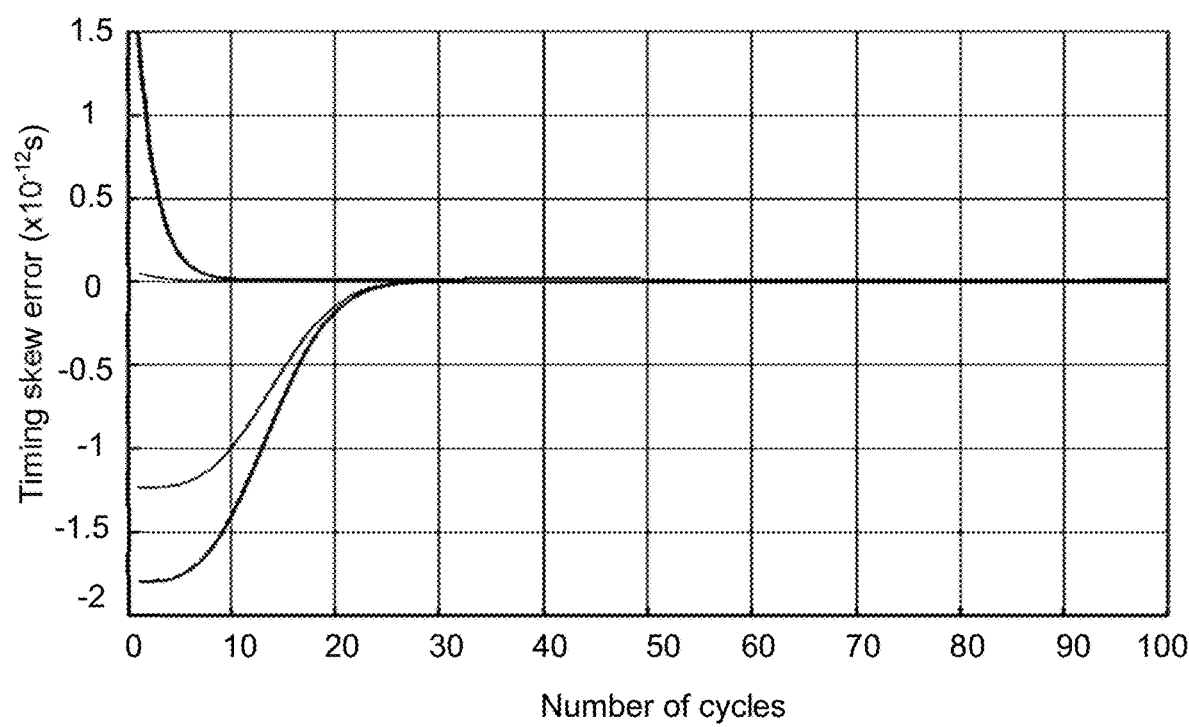
FIG. 8 is an example plot of absolute residual timing skew as a function of a number of skew calibration cycles for a time-interleaved ADC using the timing calibration loop of FIG. 7.

An example plot of timing skew as a function of number of cycles, using the above LMS iterative algorithm, is illustrated in FIG. 8. The timing skew error $\Delta t_i$ converges in this example to less than $10^{-13}$ seconds within around 30 cycles of the algorithm.

In a general aspect therefore, the time-interleaved ADC 405 may comprise a plurality of ADC channels and be configured to perform skew calibration of the ADC channels using the plurality of analog sinusoidal signals with an iterative least mean square algorithm.

Figure 9:
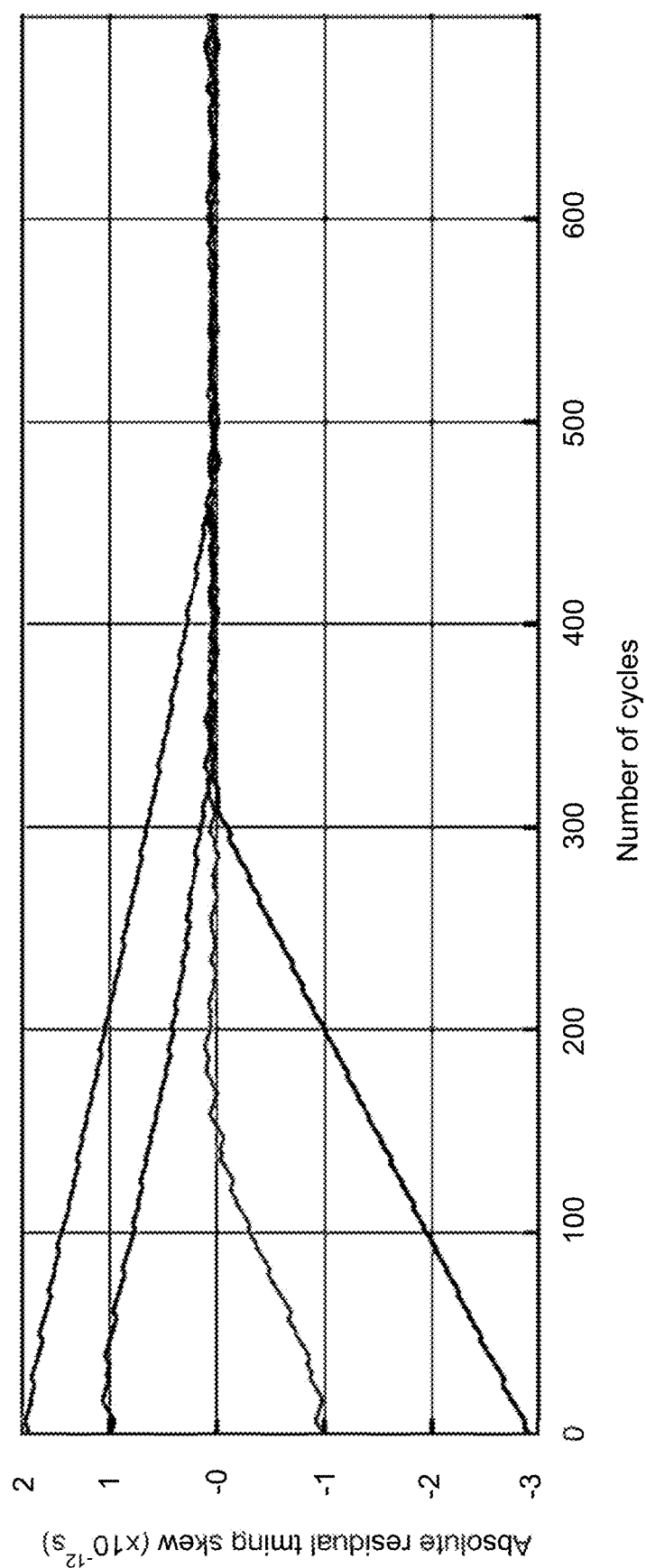
FIG. 9 is an example plot of absolute residual timing skew for the example time-interleaved ADC circuit of FIG. 4.
Figure 10:
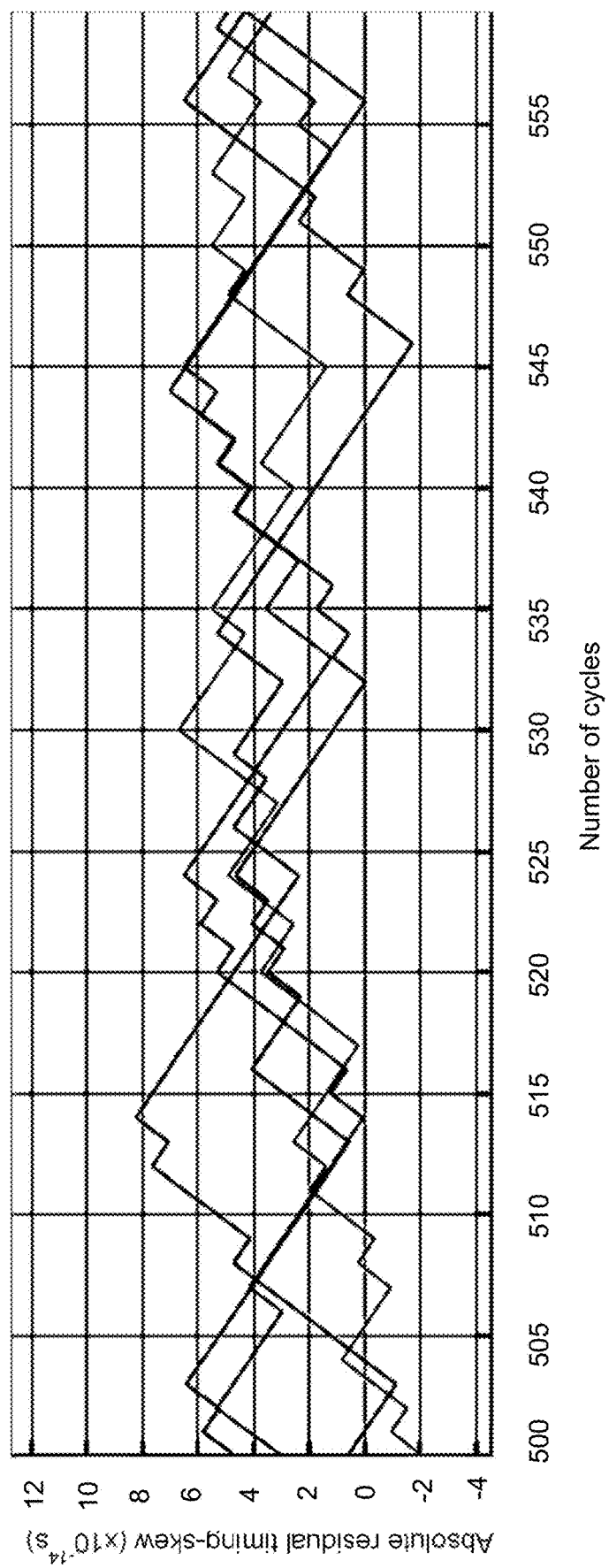
FIG. 10 is a detail view of a portion of the plot of FIG. 9.

FIG. 9 is an example plot of absolute residual timing skew as a function of the number of skew calibration cycles, for the time-interleaved ADC circuit 400. Each trace represents the relative timing skew of one of four different ADC channels. After around 450 iterations, the residual time skew of all channels is reduced to less than around 150 fs (1 fs=$10^{-15}$ s). This is further illustrated in FIG. 10, which shows the absolute residual timing skew for the same data between 500 and 560 cycles.

The effective number of bits (ENOB) in the uncalibrated signal is limited by spurs to around 4.7 bits, whereas the ENOB after skew calibration is around 9.8 bits. This effect is illustrated by the difference between the output signals in FIGS. 2a and 2b, and is further illustrated in FIGS. 11 to 13.

Figure 11:
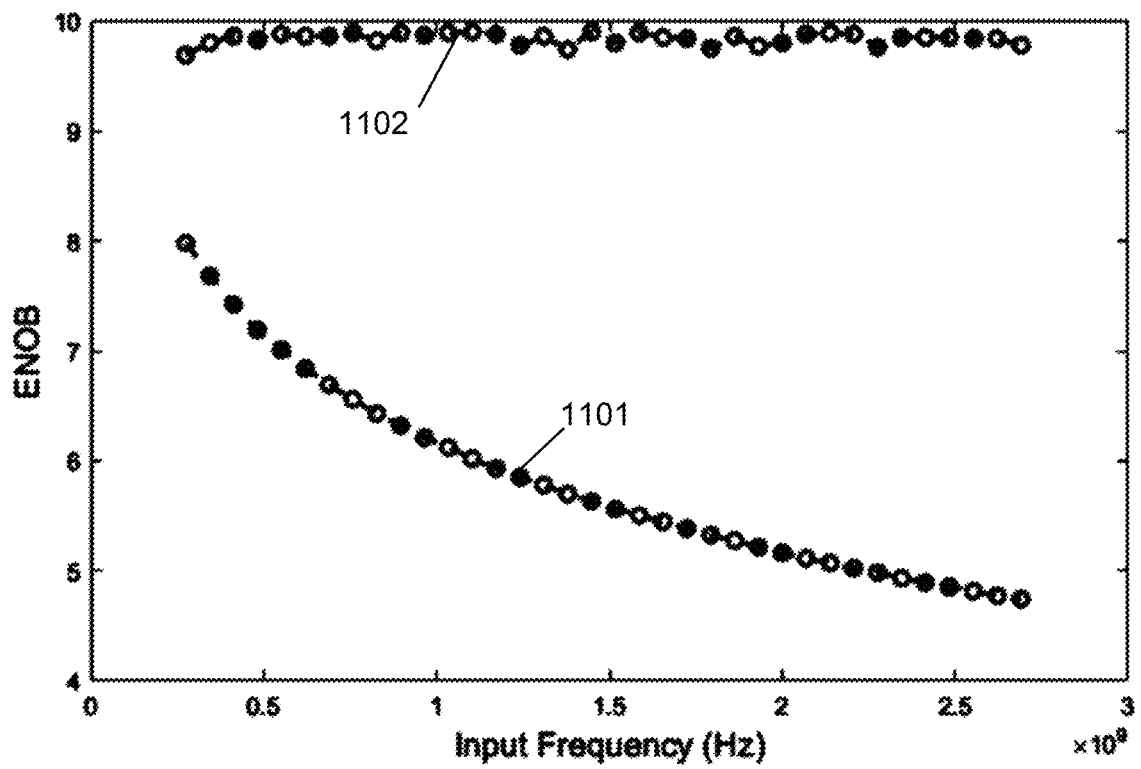
FIG. 11 is an example plot of effective number of bits (ENOB) as a function of input frequency for a time-interleaved ADC with and without skew calibration.

FIG. 11 illustrates the ENOB as a function of frequency. Without skew calibration, the ENOB 1101 varies from around 8 at below 0.5 GHz to less than 5 above around 2.2 GHz, whereas the ENOB 1102 after skew calibration is between around 9.5 and 10 over the entire range.

Figure 12:
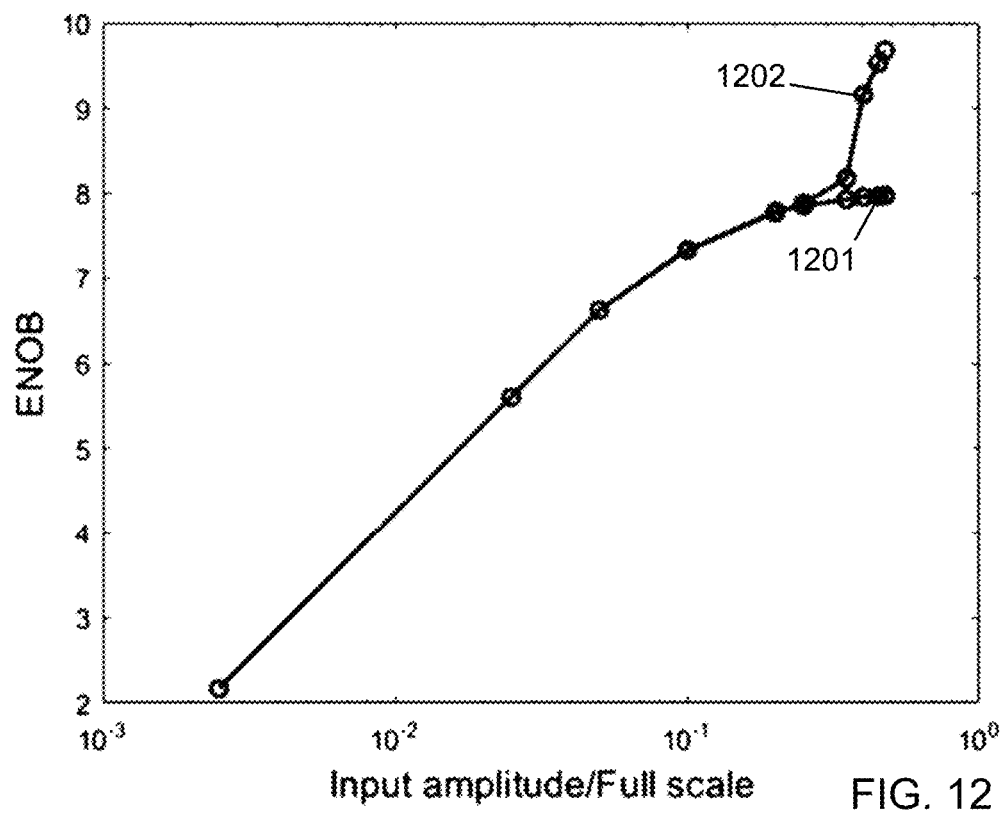
FIGS. 12 and 13 are example plots of ENOB as a function of relative input amplitude with and without skew calibration for low and high signal frequencies respectively.

FIG. 12 illustrates ENOB as a function of input amplitude at low frequency, in this example around 274 MHz. The ENOB up to around 0.15 is similar with and without skew calibration, but diverges above this resulting in the ENOB 1201 without skew calibration remaining below 8 while the ENOB 1202 after skew calibration rises to above 9.5 at a relative amplitude of 0.5.

Figure 13:
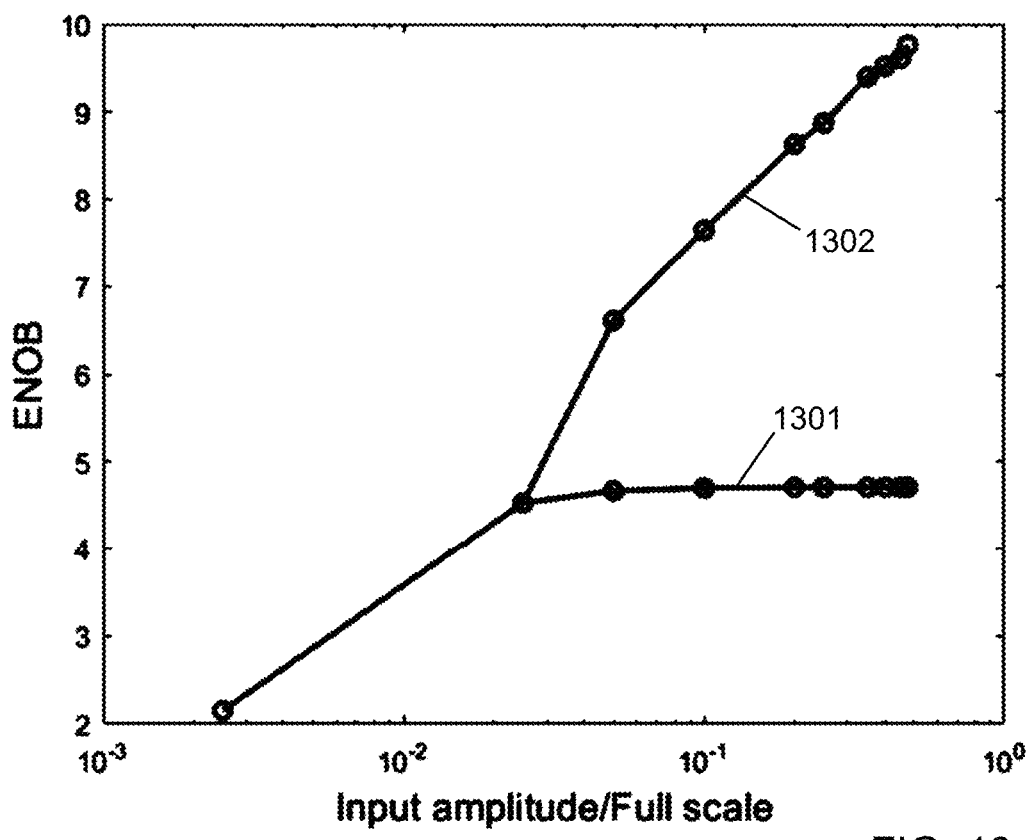

FIG. 13 illustrates ENOB as a function of input amplitude at high frequency, in this example around 2.735 GHz. The ENOB up to around 0.015 is similar with and without skew calibration, but diverges above this resulting in the ENOB 1301 without skew calibration remaining below 5 while the ENOB 1302 after skew calibration again rises to above 0.5 at a relative amplitude of 0.5.

Figure 14:
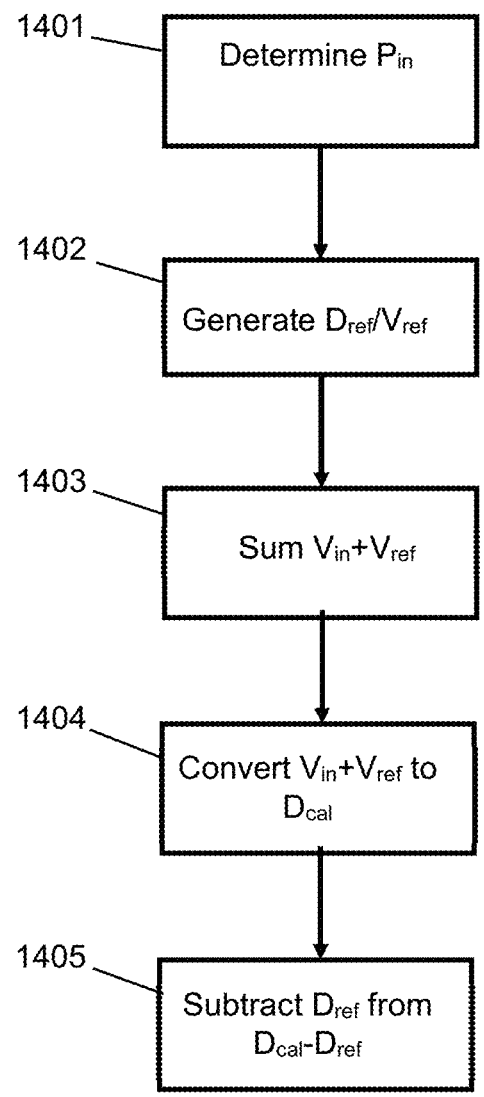
FIG. 14 is a flow diagram illustrating an example method of operating a time-interleaved ADC circuit.

FIG. 14 illustrates a flow diagram of an example method of operating the time-interleaved ADC circuit 400 as described above. In a first step 1401 an input signal amplitude $P_{in}$ of an analog input signal $V_{in}$ is determined with the input signal amplitude detector 401. In a second step 1402, a plurality of analog and digital sinusoidal signals $V_{ref}$, $D_{ref}$ having an amplitude dependent on the determined input signal amplitude $P_{in}$ are generated by the multi-tone signal generator 402 (and the DAC 403). In a third step 1403, the analog input signal $V_{in}$ and the analog sinusoidal signals $V_{ref}$ are summed with the analog input summing module 404 to provide a summed output analog signal $V_{in}+V_{ref}$. In a fourth step 1404, the summed output analog signal $V_{in}+V_{ref}$ is converted by the time-interleaved ADC to provide a timing skew-calibrated digital output signal $D_{cal}$. In a fifth step 1405, the digital sinusoidal signals $D_{ref}$ are subtracted from the timing skew-calibrated digital output signal $D_{cal}$ with the digital output subtractor module 406 to provide a digital output signal $D_{out}$ at the output 408 of the circuit 400. Various optional features described above may also be applied to the steps of the method.

From reading the present disclosure, other variations and modifications will be apparent to the skilled person. Such variations and modifications may involve equivalent and other features which are already known in the art of analog to digital converters, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The following are some embodiments of the present invention.

According to a first aspect, a time-interleaved analog to digital converter (ADC) circuit includes an input signal amplitude detector configured to determine an input signal amplitude of an analog input signal at an input of the circuit; a multi-tone signal generator configured to generate a plurality of analog and digital sinusoidal signals having an amplitude dependent on the determined input signal amplitude; an analog input summing module configured to provide a summed output analog signal from the analog input signal and the analog sinusoidal signals; a time-interleaved ADC having an input coupled to receive the summed output analog signal from the analog input summing module and configured to provide a timing skew-calibrated digital output signal from the summed output analog signal; and a digital output subtractor module configured to provide a digital output signal at an output of the circuit from the digital output signal from the time-interleaved ADC and the digital sinusoidal signals from the multi-tone signal generator.

The circuit enables correction of timing errors in a time-interleaved ADC independent of the input signal amplitude and frequency by generating and applying fixed frequency input signals to the ADC input that are dependent on the input signal amplitude and removing these signals at the digital output of the ADC.

The multi-tone signal generator may include a digital to analog converter (DAC) configured to generate the analog sinusoidal signals from the digital sinusoidal signals. The multi-tone signal generator may also comprise an analog filter between the DAC and the analog input summing module that is configured to filter the analog sinusoidal signals.

The multi-tone signal generator may be configured to generate the plurality of analog and digital sinusoidal signals having frequencies above a frequency range of the analog input signal and below a Nyquist limit of the time-interleaved ADC.

The multi-tone signal generator may be configured to provide the digital sinusoidal signals to the digital output subtractor module with a time delay relative to the analog sinusoidal signals provided to the analog input summing module.

The input signal amplitude detector may include an ADC configured to detect an instantaneous peak level of the input signal and provide the input amplitude signal in digital form to the multi-tone signal generator.

The multi-tone signal generator may be configured to generate the digital sinusoidal signals by direct digital synthesis with a resolution equal to that of the time-interleaved ADC.

The time-interleaved ADC may include a plurality of ADC channels and may be configured to perform skew calibration of the plurality of ADC channels using the plurality of analog sinusoidal signals. Each of the plurality of ADC channels may include a timing calibration loop configured to correct a timing error of the ADC channel. Each of the plurality of ADC channels of the time-interleaved ADC may be configured to perform skew calibration using an iterative least mean square algorithm.

According to a second aspect, a method of converting an input analog signal to an output digital signal with a time-interleaved analog to digital converter (ADC) circuit includes determining an input signal amplitude of an analog input signal at an input of the circuit with an input signal amplitude detector; generating a plurality of analog and digital sinusoidal signals having an amplitude dependent on the determined input signal amplitude with a multi-tone signal generator; summing the analog input signal and the analog sinusoidal signals with an analog input summing module to provide a summed output analog signal; providing the summed output analog signal to a time-interleaved ADC; converting the summed output analog signal with the time-interleaved ADC to provide a timing skew-calibrated digital output signal; and subtracting the digital sinusoidal signals from the timing skew-calibrated digital output signal with a digital output subtractor module to provide a digital output signal at an output of the circuit.

A DAC of the multi-tone signal generator may generate the analog sinusoidal signals from the digital sinusoidal signals. An analog filter between the DAC and the analog input summing module may filter the analog sinusoidal signals.

The multi-tone signal generator may generate the plurality of analog and digital sinusoidal signals having frequencies above a frequency range of the analog input signal and below a Nyquist limit of the time-interleaved ADC.

The multi-tone signal generator may provide the digital sinusoidal signals to the digital output subtractor module with a time delay relative to the analog sinusoidal signals provided to the analog input summing module.

The input signal amplitude detector may include an ADC that detects an instantaneous peak level of the input signal and provide the input amplitude signal in digital form to the multi-tone signal generator.

The multi-tone signal generator may generate the digital sinusoidal signals by direct digital synthesis with a resolution equal to that of the time-interleaved ADC.

The time-interleaved ADC may include a plurality of ADC channels and perform skew calibration of the plurality of ADC channels using the plurality of analog sinusoidal signals. Each of the plurality of ADC channels may comprise a timing calibration loop configured to correct a timing error of the ADC channel. Each of the plurality of ADC channels of the time-interleaved ADC may perform skew calibration of the plurality of ADC channels using an iterative least mean square algorithm.

The invention claimed is:

1. A time-interleaved analog to digital converter (ADC) circuit comprising:
   an input signal amplitude detector configured to determine an input signal amplitude of an analog input signal at an input of the circuit;
   a multi-tone signal generator configured to generate a plurality of analog and digital sinusoidal signals having an amplitude dependent on the determined input signal amplitude and having frequencies above a frequency range of the analog input signal and below a Nyquist limit of the time-interleaved ADC;
   an analog input summing module configured to provide a summed output analog signal from the analog input signal and the analog sinusoidal signals;
   a time-interleaved analog to digital converter (ADC) having an input coupled to receive the summed output analog signal from the analog input summing module and configured to provide a timing skew-calibrated digital output signal from the summed output analog signal; and
   a digital output subtractor module configured to provide a digital output signal at an output of the circuit from the digital output signal from the time-interleaved ADC and the digital sinusoidal signals from the multi-tone signal generator.

2. The circuit of claim 1, wherein the multi-tone signal generator comprises a digital to analog converter (DAC) configured to generate the analog sinusoidal signals from the digital sinusoidal signals.

3. The circuit of claim 2, wherein the multi-tone signal generator comprises an analog filter between the DAC and the analog input summing module configured to filter the analog sinusoidal signals.

4. The circuit of claim 1, wherein the multi-tone signal generator is configured to provide the digital sinusoidal signals to the digital output subtractor module with a time delay relative to the analog sinusoidal signals provided to the analog input summing module.

5. The circuit of claim 1, wherein the input signal amplitude detector comprises an ADC configured to detect an instantaneous peak level of the input signal and provide the input amplitude signal in digital form to the multi-tone signal generator.

6. The circuit of claim 1, wherein the time-interleaved ADC comprises a plurality of ADC channels and is configured to perform skew calibration of the plurality of ADC channels using the plurality of analog sinusoidal signals.

7. The circuit of claim 6, wherein each of the plurality of ADC channels comprises a timing calibration loop configured to correct a timing error of the ADC channel.

8. The circuit of claim 7, wherein each of the plurality of ADC channels of the time-interleaved ADC is configured to perform skew calibration using an iterative least mean square algorithm.

9. A time-interleaved analog to digital converter (ADC) circuit comprising:
   an input signal amplitude detector configured to determine an input signal amplitude of an analog input signal at an input of the circuit;
   a multi-tone signal generator configured to generate a plurality of analog and digital sinusoidal signals having an amplitude dependent on the determined input signal amplitude;
   an analog input summing module configured to provide a summed output analog signal from the analog input signal and the analog sinusoidal signals;
   a time-interleaved analog to digital converter (ADC) having an input coupled to receive the summed output analog signal from the analog input summing module and configured to provide a timing skew-calibrated digital output signal from the summed output analog signal; and
   a digital output subtractor module configured to provide a digital output signal at an output of the circuit from the digital output signal from the time-interleaved ADC and the digital sinusoidal signals from the multi-tone signal generator,
   wherein the multi-tone signal generator is configured to generate the digital sinusoidal signals by direct digital synthesis with a resolution equal to that of the time-interleaved ADC.

10. A method of converting an input analog signal to an output digital signal with a time-interleaved analog to digital converter (ADC) circuit, the method comprising:
    determining an input signal amplitude of an analog input signal at an input of the circuit with an input signal amplitude detector;
    generating a plurality of analog and digital sinusoidal signals having an amplitude dependent on the determined input signal amplitude with a multi-tone signal generator, wherein a multi-tone signal generator generates the plurality of analog and digital sinusoidal signals having frequencies above a frequency range of the analog input signal and below a Nyquist limit of the time-interleaved ADC;
    summing the analog input signal and the analog sinusoidal signals with an analog input summing module to provide a summed output analog signal;
    providing the summed output analog signal to a time-interleaved ADC;
    converting the summed output analog signal with the time-interleaved ADC to provide a timing skew-calibrated digital output signal; and
    subtracting the digital sinusoidal signals from the timing skew-calibrated digital output signal with a digital output subtractor module to provide a digital output signal at an output of the circuit.

11. The method of claim 10, wherein a digital to analog converter (DAC) of the multi-tone signal generator generates the analog sinusoidal signals from the digital sinusoidal signals.

12. The method of claim 11, wherein an analog filter between the DAC and the analog input summing module filters the analog sinusoidal signals.

13. The method of claim 10, wherein the multi-tone signal generator provides the digital sinusoidal signals to the digital output subtractor module with a time delay relative to the analog sinusoidal signals provided to the analog input summing module.

14. The method of claim 10, wherein the input signal amplitude detector comprises an ADC that detects an instantaneous peak level of the input signal and provides the input amplitude signal in digital form to the multi-tone signal generator.

15. The method of claim 10, wherein the time-interleaved ADC comprises a plurality of ADC channels and performs skew calibration of the plurality of ADC channels using the plurality of analog sinusoidal signals.

16. The method of claim 15, wherein each of the plurality of ADC channels comprises a timing calibration loop configured to correct a timing error of the ADC channel.

17. The method of claim 16, wherein each of the plurality of ADC channels of the time-interleaved ADC performs skew calibration using an iterative least mean square algorithm.

18. A method of converting an input analog signal to an output digital signal with a time-interleaved analog to digital converter (ADC) circuit, the method comprising:
    determining an input signal amplitude of an analog input signal at an input of the circuit with an input signal amplitude detector;
    generating a plurality of analog and digital sinusoidal signals having an amplitude dependent on the determined input signal amplitude with a multi-tone signal generator;
    summing the analog input signal and the analog sinusoidal signals with an analog input summing module to provide a summed output analog signal;
    providing the summed output analog signal to a time-interleaved ADC;
    converting the summed output analog signal with the time-interleaved ADC to provide a timing skew-calibrated digital output signal; and
    subtracting the digital sinusoidal signals from the timing skew-calibrated digital output signal with a digital output subtractor module to provide a digital output signal at an output of the circuit,
    wherein a multi-tone signal generator generates the digital sinusoidal signals by direct digital synthesis with a resolution equal to that of the time-interleaved ADC.

* * * * *